(12) United States Patent
Shimizu et al.

(10) Patent No.: US 9,374,916 B2
(45) Date of Patent: Jun. 21, 2016

(54) ELECTRICAL JUNCTION BOX

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventors: Tatsuya Shimizu, Mie (JP); Takehiro Mizuno, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 100 days.

(21) Appl. No.: 14/377,406

(22) PCT Filed: Feb. 15, 2013

(86) PCT No.: PCT/JP2013/053646
§ 371 (c)(1),
(2) Date: Aug. 7, 2014

(87) PCT Pub. No.: WO2013/129132
PCT Pub. Date: Sep. 6, 2013

(65) Prior Publication Data
US 2015/0029686 A1     Jan. 29, 2015

(30) Foreign Application Priority Data

Feb. 27, 2012   (JP) ................ 2012-039823

(51) Int. Cl.
*H05K 5/00*     (2006.01)
*H02G 3/16*     (2006.01)
(Continued)

(52) U.S. Cl.
CPC .......... *H05K 5/0056* (2013.01); *B60R 16/0238* (2013.01); *H02G 3/086* (2013.01); *H02G 3/16* (2013.01); *H05K 5/006* (2013.01); *H05K 5/0013* (2013.01); *H05K 5/0052* (2013.01)

(58) Field of Classification Search
CPC ............... H05K 5/0013; H05K 5/0056; B60R 16/0239; H02G 3/086; H02G 3/088
See application file for complete search history.

(56) References Cited

U.S. PATENT DOCUMENTS 5,383,098 A * 1/1995 Ma ....................... H04B 1/3833
174/371
5,461,542 A * 10/1995 Kosak ................ B60R 16/0239
165/185

(Continued)

FOREIGN PATENT DOCUMENTS

JP    U-63-59383     4/1988
JP    U-64-30625     2/1989
(Continued)

OTHER PUBLICATIONS

International Search Report dated Mar. 19, 2013 from International Application No. PCT/JP2013/053646 (with English-language translation).

*Primary Examiner* — Adrian S Wilson
(74) *Attorney, Agent, or Firm* — Oliff PLC (57) ABSTRACT

An electrical junction box includes a case including a bottom plate portion and case-side peripheral wall portion extending from a peripheral edge of the bottom plate portion, the case having an opening that opens to a lateral side, a circuit structure is accommodated in the case, and a cover closes the opening and includes a lid plate portion and cover-side peripheral wall portion extending upright from a peripheral edge of the lid plate portion and covering a perimeter of the case-side peripheral wall portion. The circuit structure includes a circuit board and electronic components mounted on a mounting surface of the circuit board, and is accommodated in the case with the mounting surface of the circuit board facing the opening. The circuit structure is disposed in the case with a space allowing water to pass through provided between an inner surface of the bottom plate portion and circuit structure.

5 Claims, 5 Drawing Sheets

(51) Int. Cl.
*B60R 16/023* (2006.01)
*H02G 3/08* (2006.01)

(56) References Cited

U.S. PATENT DOCUMENTS

| | | | | |
|---|---|---|---|---|
| 5,613,237 | A * | 3/1997 | Bent | H04B 1/086 |
| | | | | 220/4.02 |
| 6,411,514 | B1 * | 6/2002 | Hussaini | H05K 7/209 |
| | | | | 165/104.33 |
| 7,642,452 | B2 * | 1/2010 | Kanazawa | H02G 3/088 |
| | | | | 174/50 |
| 7,712,621 | B2 * | 5/2010 | Cho | H05K 5/0213 |
| | | | | 220/4.28 |
| 7,736,158 | B2 * | 6/2010 | Yamaguchi | H05K 7/026 |
| | | | | 439/271 |
| 8,446,724 | B2 * | 5/2013 | Shimizu | H02G 3/03 |
| | | | | 361/679.49 |
| 8,912,438 | B2 * | 12/2014 | Zadesky | G06F 1/1626 |
| | | | | 174/50 |
| 9,204,562 | B2 * | 12/2015 | Shimizu | H02G 3/16 |
| 2001/0022232 | A1 * | 9/2001 | Ichikawa | H05K 5/0013 |
| | | | | 174/50 |
| 2004/0034994 | A1 * | 2/2004 | Chang | H05K 7/142 |
| | | | | 29/760 |
| 2006/0021779 | A1 | 2/2006 | Kanazawa | |
| 2006/0158845 | A1 * | 7/2006 | Kim | G06F 1/1601 |
| | | | | 361/679.46 |
| 2006/0260834 | A1 | 11/2006 | Kanazawa et al. | |
| 2009/0078442 | A1 * | 3/2009 | Lin | H02G 3/121 |
| | | | | 174/50.51 |
| 2009/0117758 | A1 * | 5/2009 | Yamaguchi | H05K 7/026 |
| | | | | 439/76.2 |
| 2009/0298311 | A1 * | 12/2009 | Nakanishi | H02G 3/088 |
| | | | | 439/76.2 |
| 2010/0134975 | A1 * | 6/2010 | Shimizu | H02G 3/03 |
| | | | | 361/694 |
| 2013/0050945 | A1 * | 2/2013 | Diep | G06F 1/181 |
| | | | | 361/704 |
| 2015/0303666 | A1 * | 10/2015 | Shimizu | H02G 3/16 |
| | | | | 361/752 |

FOREIGN PATENT DOCUMENTS

| | | |
|---|---|---|
| JP | U-3-81682 | 8/1991 |
| JP | A-2006-74988 | 3/2006 |

* cited by examiner

ELECTRICAL JUNCTION BOX

BACKGROUND

The present application relates to an electrical junction box.

Conventionally, some of the electrical junction boxes that are disposed in submersible regions of engine compartments of automobiles are provided with a waterproof structure that prevents water from entering the inside of the electrical junction boxes (see JP 2006-74988A).

Unlike the electrical junction boxes disposed in engine compartments, electrical junction boxes that are disposed in passenger compartments do not require an advanced waterproof structure, and it is sufficient if those electrical junction boxes have a water blocking structure that can avoid adhesion of water to a surface of a circuit structure on which electronic components are mounted even if a small amount of water enters the inside of the electrical junction boxes.

Applying an advanced waterproof structure as described above to those electrical junction boxes increases the cost, and therefore there is room for improvement.

The present application was made in view of the circumstances as described above, and it is an object thereof to provide an electrical junction box having a water blocking structure that inhibits adhesion of water to a circuit structure at low cost.

SUMMARY

The present application is an electrical junction box including a case that includes a bottom plate portion and a case-side peripheral wall portion extending upright from a peripheral edge of the bottom plate portion, the case having an opening that opens to a lateral side, a circuit structure that is accommodated in the case, and a cover that closes the opening of the case and includes a lid plate portion and a cover-side peripheral wall portion extending upright from a peripheral edge of the lid plate portion and covering a perimeter of the case-side peripheral wall portion, wherein the circuit structure includes a circuit board and electronic components that are mounted on a mounting surface of the circuit board, and is accommodated in the case such that the mounting surface of the circuit board faces the opening, and the circuit structure is disposed in the case with a space that allows water to pass through being provided between an inner surface of the bottom plate portion and the circuit structure.

DETAILED DESCRIPTION

In the electrical junction box of the application, even if water enters a space between the case-side peripheral wall portion and the cover-side peripheral wall portion and goes all the way to the inside of the case-side peripheral wall portion, that water moves along the inside of the case-side peripheral wall portion to reach the surface of the bottom plate portion, and falls downward through the space between a back surface of the circuit board and the inner surface of the bottom plate portion of the case. Thus, even if water enters the inside of the case, adhesion of that water to the mounting surface (surface on the side on which the electronic components are mounted) of the circuit board can be avoided.

The electrical junction box according to the present application more preferably has the following configurations in addition to the above-described configuration.

It is preferable that the case-side peripheral wall portion is formed such that a region of the case-side peripheral wall portion on the side of the opening protrudes outward beyond a region of the case-side peripheral wall portion on the side of the bottom plate portion, and a step surface is formed between the region on the side of the opening and the region on the side of the bottom plate portion, support protrusions protrude from the inner surface of the bottom plate portion, the support protrusions supporting the circuit board with a space provided between the inner surface of the bottom plate portion and the circuit board, and in a state in which the circuit board is supported by the support protrusions, the mounting surface and the step surface are at substantially the same height.

With this configuration, as large a space as possible can be secured as the space that allows water to pass through. Also, since the circuit board is not disposed in a position at which the circuit board protrudes toward the opening beyond the step surface, an increase in the size of the electrical junction box can be suppressed.

It is also possible that in a state in which the cover and the case are assembled, the cover includes a waterproof wall that protrudes from the lid plate portion toward the case, is disposed at a position to the inside of the case-side upper wall portion, and overhangs the circuit structure.

With this configuration, even if water that has entered the inside of the case-side upper wall portion falls downward, that water is blocked by the waterproof wall. Thus, even if water enters the inside of the case, adhesion of that water to the circuit board can be more reliably avoided.

It is also possible that in a state in which the circuit structure is accommodated in the case, a protruding length of the waterproof wall is set at such a length that a protruding end of the waterproof wall is positioned closer to the bottom plate portion than a non-mounting surface of the circuit board on which no electronic components are mounted is, while being slightly spaced apart from the inner surface of the bottom plate portion.

With this configuration, water that has entered the inside of the case-side upper wall portion and fallen onto the waterproof wall moves on the upper surface of the waterproof wall and is guided to the non-mounting surface side of the circuit board, and then falls downward along the inner surface of the bottom plate portion. Thus, adhesion of water that has entered the inside to the mounting surface of the circuit board can be more reliably avoided.

It is also possible that a sloping surface is formed on an upper surface of the waterproof wall, the sloping surface sloping down toward the bottom plate portion in a state in which the cover and the case are assembled.

With this configuration, water that has fallen onto the waterproof wall flows down to the side of the bottom plate portion in accordance with the slope of the sloping surface, and is therefore readily drained to the non-mounting surface side of the circuit board. Thus, even if water enters the inside of the case, adhesion of that water to the front surface of the circuit board can be more reliably avoided.

It is also possible that a drain hole is formed in at least one of a case-side lower wall portion of the case-side peripheral wall portion that is located on a lower side in a state in which the electrical junction box is used and a cover-side lower wall portion of the cover-side peripheral wall portion that is located on the lower side in the state in which the electrical junction box is used, the drain hole passing through the at least one of the case-side lower wall portion and the cover-side lower wall portion in a vertical direction.

With this configuration, even if water enters the inside of the case, that water is quickly drained to the outside through the drain hole. Thus, accumulation of water that has entered the inside of the case and and adhesion of the water to the circuit structure can be avoided.

Moreover, a water blocking structure as described above can be attained with a relatively small increase in cost as compared with a case structure with respect to which no countermeasure is taken. Thus, an electrical junction box having a water blocking structure can be provided at low cost.

According to the present application, it is possible to provide an electrical junction box having a water blocking structure that inhibits adhesion of water to a circuit structure at low cost.

Figure 1:
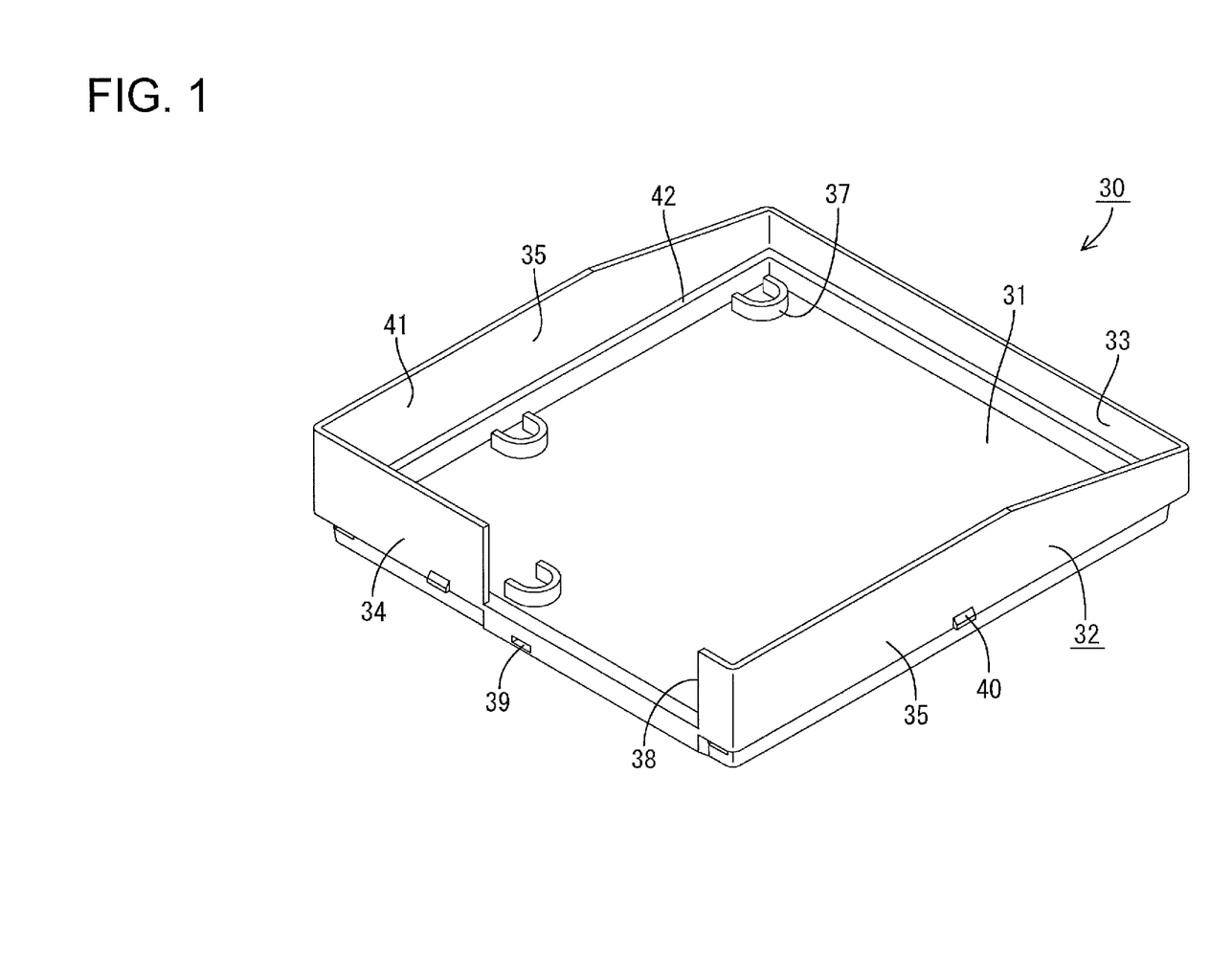
FIG. 1 is a perspective view of a case according to an embodiment.
Figure 2:
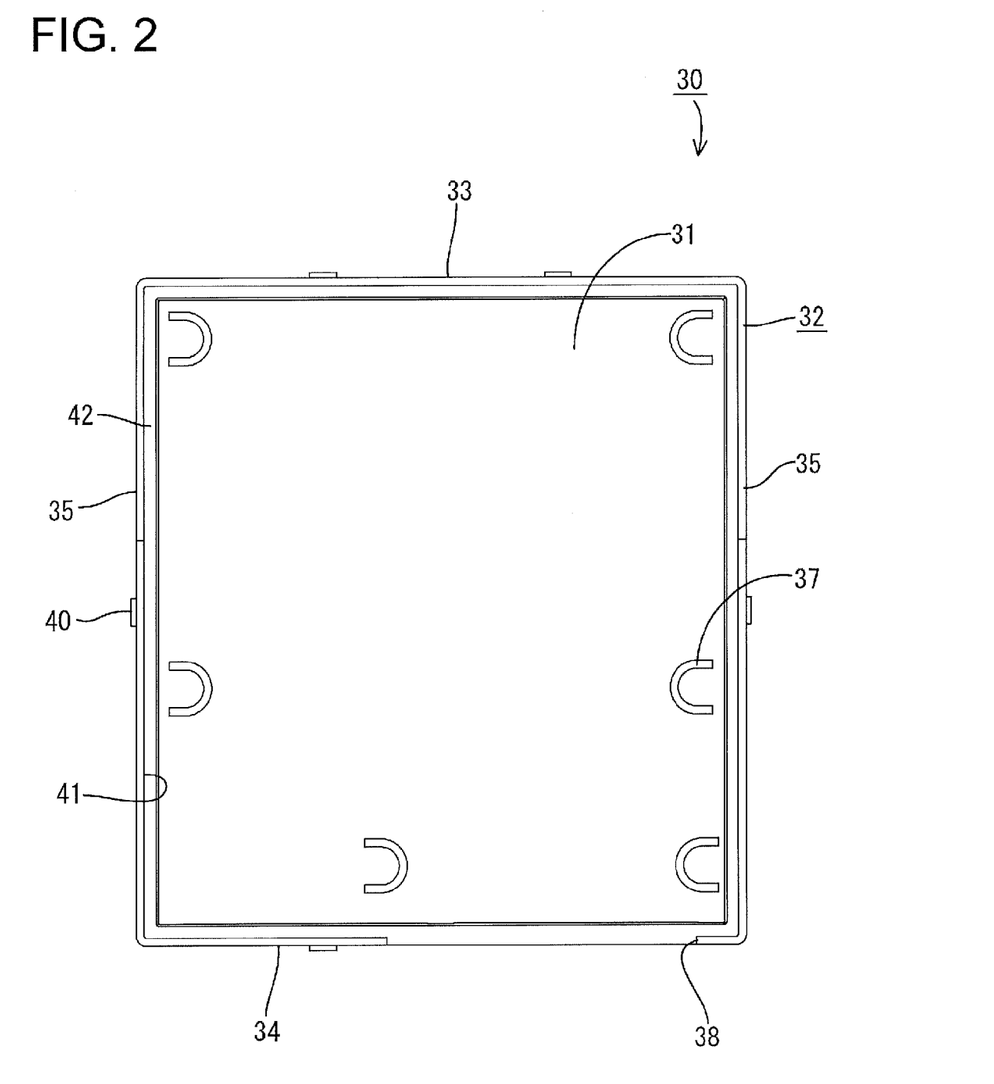
FIG. 2 shows the case according to the embodiment as seen from the side of an opening.
Figure 3:
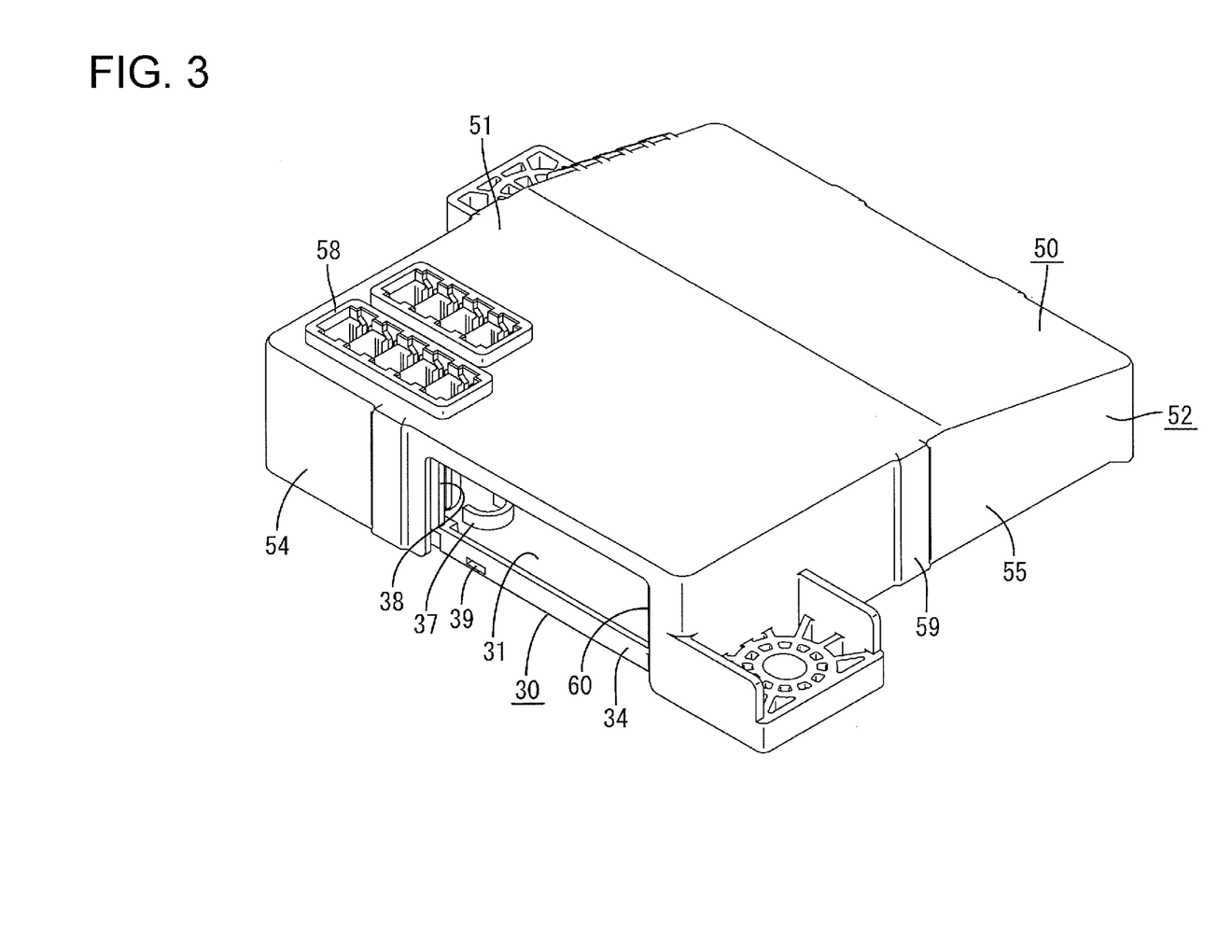
FIG. 3 is a perspective view of an electrical junction box according to the embodiment.
Figure 4:
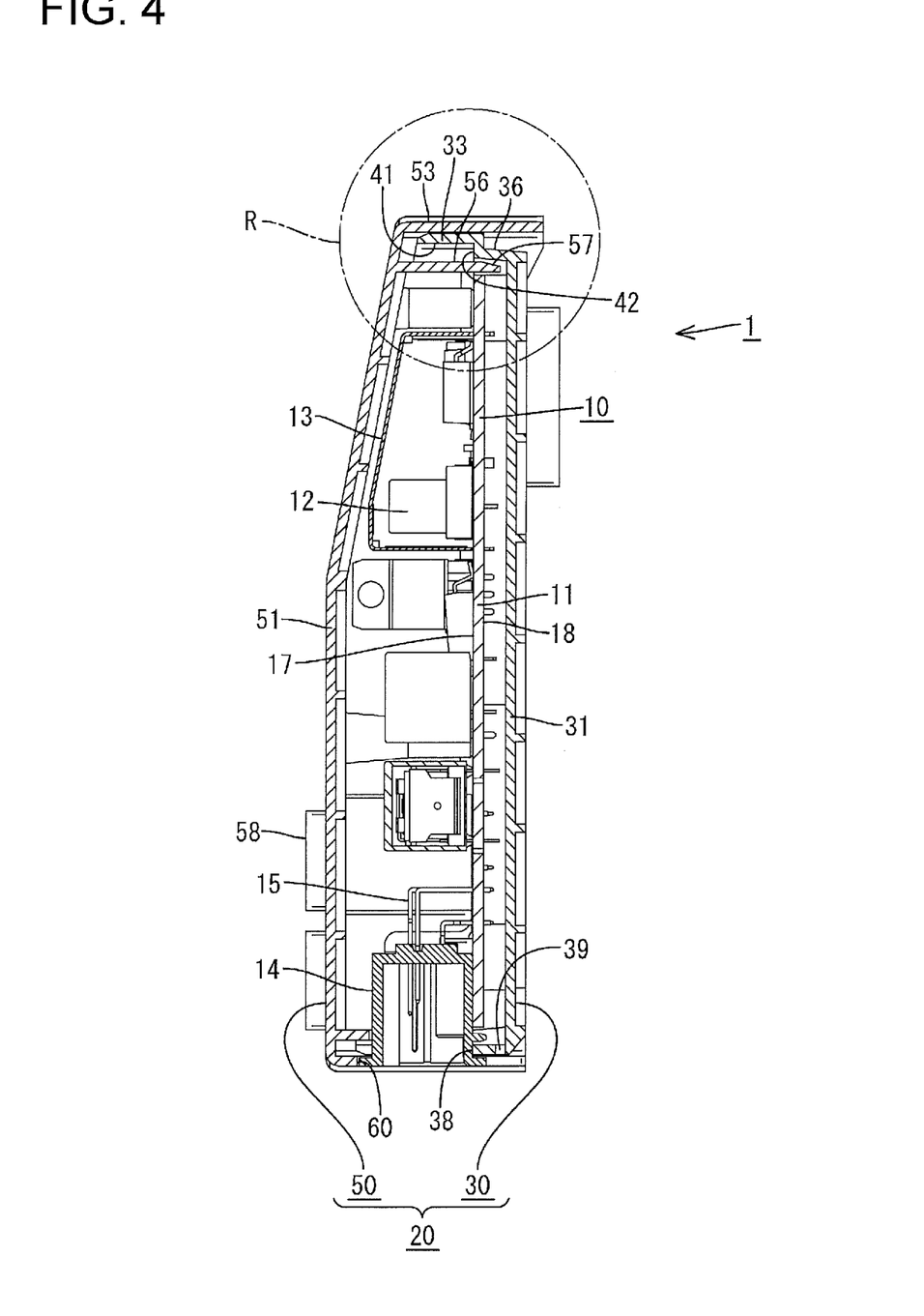
FIG. 4 is a cross-sectional view of the electrical junction box according to the embodiment.
Figure 5:
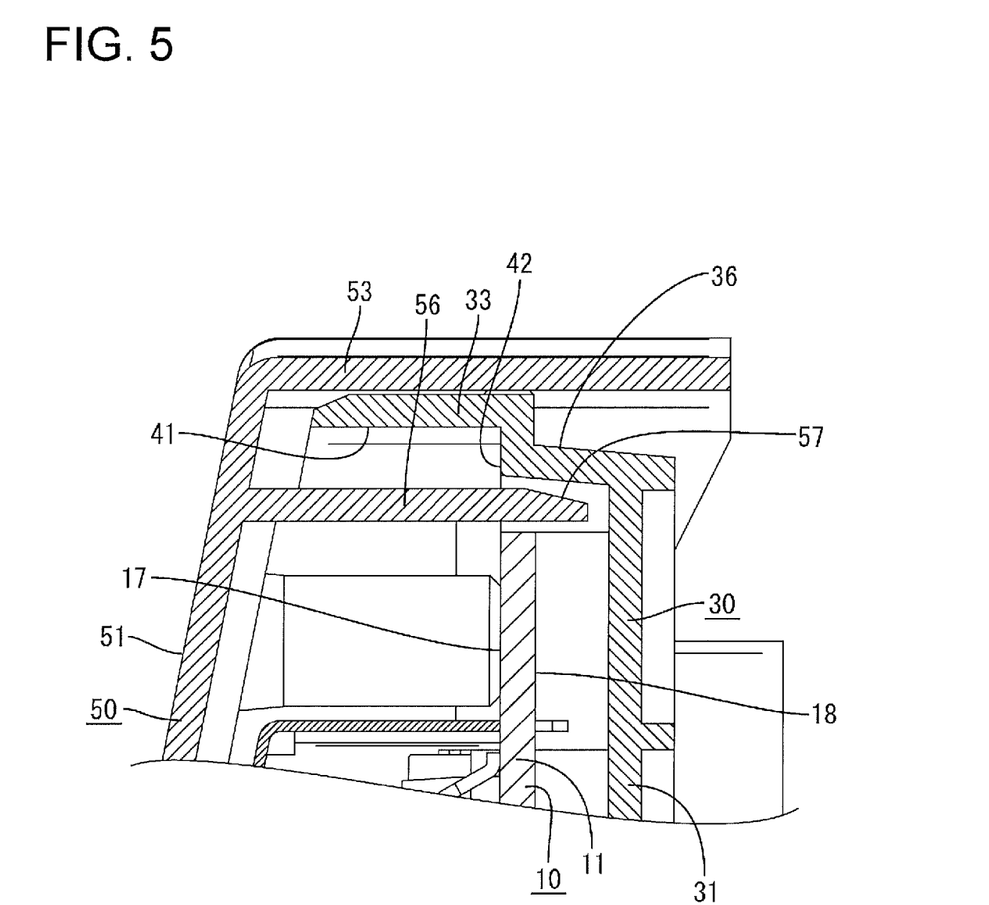
FIG. 5 is an enlarged view of a portion enclosed by circle R in FIG. 4.

An embodiment of the present application will be described in detail with reference to FIGS. 1 to 5.

An electrical junction box 1 according to this embodiment is installed in a passenger compartment of a vehicle and used, and includes a circuit structure 10 and a casing 20 that accommodates this circuit structure 10.

The circuit structure 10 includes a circuit board 11 including a conductor circuit (not shown) and electronic components 12 installed (mounted) on a front surface (mounting surface 17) of this circuit board 11. No electronic component 12 is mounted (installed) on a back surface (non-mounting surface 18) of the circuit board 11. Some electronic components 12 of the plurality of electronic components 12 that are installed on the circuit board 11 are covered by a shield shell 13 made of a metal.

Electronic components that generate radiation noise are disposed in an upper region of the mounting surface 17 of the circuit board 11, the region constituting about one-third of the mounting surface 17, and electronic components that do not generate radiation noise are disposed below that region. The shield shell 13 covers the upper region constituting about one-third of the mounting surface 17 of the circuit board 11.

A connector fitting portion 14 into which a counterpart connector that is connected to a power supply or on-vehicle electrical equipment can be fitted is formed in a certain region in a lower portion of the front surface of the circuit board 11 such that the connector fitting portion 14 opens downward. Connecting terminals 15 that are electrically connected to the conductor circuit provided in the circuit board 11 are exposed inside the connector fitting portion 14. Also, fuse terminals (not shown) that are electrically connected to the conductor circuit are disposed in another region in the lower portion of the mounting surface 17 of the circuit board 11.

This circuit structure 10 is accommodated in the casing 20 in a portrait orientation, that is, in such an orientation that the direction in which a board surface of the circuit board 11 extends is a longitudinal direction.

The casing 20 is made of a synthetic resin, and includes a case 30 that accommodates the circuit structure 10 and a cover 50 that is attached to the case 30 so as to close an opening 41 of the case 30. The case 30 is formed in the shape of a flat box whose lateral side is open, and the circuit structure 10 is accommodated in the case 30 such that the side of the mounting surface 17 (the side on which the electronic components 12 are mounted) faces the opening 41. The case 30 includes a bottom plate portion 31 that is formed in a rectangular shape slightly larger than the circuit structure 10 and a case-side peripheral wall portion 32 that extends upright from a peripheral edge of the bottom plate portion 31. The case-side peripheral wall portion 32 includes a first upper plate portion 33 (corresponding to a case-side upper wall portion), a first lower plate portion 34 (corresponding to a case-side lower wall portion), and first side plate portions 35, which are located on the upper side, the lower side, and the left and right sides, respectively, in a state in which the electrical junction box 1 is disposed in a vehicle and used.

In the case-side peripheral wall portion 32, a step is formed that extends over the entire widths of the first upper plate portion 33 and the first side plate portions 35 and a portion of the first lower plate portion 34 excluding the position in which a case-side connector opening 38 (described later) is formed. That is to say, with respect to the entire widths of the first upper plate portion 33 and the first side plate portions 35 and the portion of the first lower plate portion 34 excluding the position in which the case-side connector opening 38 is formed, the case-side peripheral wall portion 32 is shaped such that it extends from the peripheral edge of the bottom plate portion 31 toward the front side (toward the opening 41), then further extends outward from an end of the extension, and yet further extends toward the front side from an end of the outward extension. Thus, a region of the case-side peripheral wall portion 32 on the side of the opening 41 protrudes outward beyond a region of the case-side peripheral wall portion 32 on the side of the bottom plate portion 31, and a step surface 42 is provided between the region on the side of the opening 41 and the region on the side of the bottom plate portion 31. It should be noted that in the first upper plate portion 33, an upper surface of the lower region (region on the side of the bottom plate portion 31) serves as a first sloping surface 36 (corresponding to a sloping surface) that slopes down toward the bottom plate portion 31 over the entire width of the first upper plate portion 33.

A plurality of support protrusions 37 are provided so as to protrude from an inner surface of the bottom plate portion 31, the support protrusions 37 being provided to support the circuit structure 10 (circuit board 11) in a state in which a space is left between the circuit structure 37 and the inner surface of the bottom plate portion 31. The height of the support protrusions 37 is set to be lower than the height of the step surface 42 of the case-side peripheral wall portion 32 from the bottom plate portion 31 by the thickness of the circuit board 11, and the circuit structure 10 is accommodated in the case 30 in a state in which this step surface 42 and the mounting surface 17 of the circuit board 11 are at substantially the same height.

The case-side connector opening 38 for exposing the connector fitting portion 14 of the circuit structure 10 to the outside is formed in the first lower plate portion 34. The case-side connector opening 38 is formed by cutting out a portion of the first lower plate portion 34 that is in alignment with the connector fitting portion 14 of the circuit structure 10, the portion spanning from an edge portion of the first lower plate portion 34 on the side of the opening 41 to a certain depth. Also, in the first lower plate portion 34, a drain hole 39 for allowing water that has entered the inside of the case 30 to drain is provided in a region between the position at which the first lower plate portion 34 is joined to the bottom plate portion 31 and the portion where the case-side connector opening 38 is formed such that the drain hole 39 passes through the first lower plate portion 34 in a vertical direction.

Locking protrusions 40 for locking the cover 50 are provided on outer surfaces of the first upper plate portion 33, the first lower plate portion 34, and the first side plate portions 35.

The cover 50 is attached to the case 30 from the front side so that the cover 50 closes the opening 41 of the case 30. The cover 50 has the shape of a flat box whose back side is open, and includes a lid plate portion 51 having the shape of a substantially rectangular plate that is slightly larger than the bottom plate portion 31 of the case 30, and a cover-side peripheral wall portion 52 extending upright from a peripheral edge of the lid plate portion 51. The cover-side peripheral wall portion 52 is formed in the shape of a rectangular frame that is slightly larger than the case-side peripheral wall portion 32 such that, in a state in which the case 30 and the cover 50 are assembled, the cover-side peripheral wall portion 52 covers the outer perimeter of the case-side peripheral wall portion 32. The cover-side peripheral wall portion 52 includes a second upper plate portion 53, a second lower plate portion 54 (corresponding to a cover-side lower wall portion), and second side plate portions 55, which are located on the upper side, the lower side, and the left and right sides, respectively, in a state in which the electrical junction box 1 is disposed in the vehicle and used.

The protruding length of the second upper plate portion 53 of the cover-side peripheral wall portion 52 is set at such a length that, in a state in which the cover 50 and the case 30 are assembled, a protruding end of the second upper plate portion 53 is located slightly further outward than the outer surface of the bottom plate portion 31, and the protruding lengths of the second lower plate portion 54 and the second side plate portions 55 are set at such lengths that, in the state in which the cover 50 and the case 30 are assembled, protruding ends of those portions are positioned substantially flush with the outer surface of the bottom plate portion 31.

Furthermore, a third upper plate portion 56 (corresponding to a waterproof wall) is provided so as to protrude from an inner surface of the lid plate portion 51. The third upper plate portion 56 is provided so as to extend upright at a position to the inside of (below) the second upper plate portion 53 with just enough space to receive the first upper plate portion 33 of the case-side peripheral wall portion 32 being left between the second upper plate portion 53 and the third upper plate portion 56. Thus, in a state in which the case 30 and the cover 50 are assembled, the first upper plate portion 33 can be received between the second upper plate portion 53 and the third upper plate portion 56.

The third upper plate portion 56 is located slightly above an upper end of the circuit structure 10, and its protruding length is set at such a length that, in a state in which the circuit structure 10 is accommodated in the casing 20, a protruding end of the third upper plate portion 56 is positioned slightly closer to the bottom plate portion 31 than the non-mounting surface 18 of the circuit board 11 is, and closer to the lid plate portion 51 than the inner surface of the bottom plate portion 31 of the case 30 is, while being spaced apart from the inner surface by a small distance.

A region of the third upper plate portion 56 that spans from its protruding end to a position that is slightly shifted toward the lid plate portion 51 from the protruding end serves as a second sloping surface 57 (corresponding to a sloping surface) that slopes down toward the protruding end (the side of the bottom plate portion 31) over the entire width of the third upper plate region 56.

A fuse attachment portion 58 to which fuses can be attached is formed in a lower portion of a front surface of the lid plate portion 51 such that the fuse attachment portion 58 opens to the front surface side. The fuse terminals provided in the circuit structure 10 are exposed inside the fuse attachment portion 58.

A plurality of lock receiving portions 59 that engage with the locking protrusions 40 of the case 30 are provided on inner surfaces of the second upper plate portion 53, the second lower plate portion 54, and the second side plate portions 55.

In the second lower plate portion 54, a cover-side connector opening 60 is formed at a position that is in alignment with the case-side connector opening 38. The cover-side connector opening 60 is formed by cutting out a portion of the second lower plate portion 54 that is in alignment with the connector fitting portion 14 of the circuit structure 10, the portion spanning from an opening-side edge portion of the second lower plate portion 54 to a certain depth. Thus, the connector fitting portion 14 of the circuit structure 10 is exposed to the outside from the cover-side connector opening 60 via the case-side connector opening 38. It should be noted that the drain hole 39, which is formed in the first lower plate portion 34, is also exposed to the outside from this cover-side connector opening 60.

Next, procedures for assembling the case 30, the cover 50, and the circuit structure 10 that are configured as described above will be described.

First, the circuit structure 10 is accommodated in the case 30 such that the mounting surface 17 (surface on which the electronic components 12 are installed) faces the opening 41 of the case 30, and the non-mounting surface 18 faces the bottom plate portion 31. At this time, the circuit structure 10 rests on the support protrusions 37, so that a space serving as a water passage is secured between the non-mounting surface 18 of the circuit structure 10 and the inner surface of the bottom plate portion 31.

Next, the cover 50 is attached from the opening side of the case 30. At this time, the first upper plate portion 33 of the case 30 is inserted between the second upper plate portion 53 and the third upper plate portion 56 of the cover 50. Then, the locking protrusions 40 and the lock receiving portions 59 engage, thereby bringing the case 30 and the cover 50 into engagement with each other.

The assembled electrical junction box 1 is installed, for example, at a predetermined position in the vehicle, that is, in the passenger compartment of the vehicle in an orientation in which the first upper plate portion 33, the second upper plate portion 53, and the third upper plate portion 56 face upward, and the circuit structure 10, which is accommodated in the electrical junction box 1, is in a portrait position, and used.

Next, the effects of this embodiment will be described.

The electrical junction box 1 according to this embodiment is installed in the passenger compartment of a vehicle, that is, a location where it is basically protected from the rain, wash water used in vehicle washing, and the like, but a case is conceivable in which a small amount of water splashes onto the electrical junction box 1 when, for example, a passenger spills water in the passenger compartment.

Here, the electrical junction box 1 according to this embodiment includes the case 30 that includes the bottom plate portion 31 and the case-side peripheral wall portion 32 extending upright from the peripheral edge of the bottom plate portion 31 and opens to the lateral side, the circuit structure 10 that is accommodated in the case 30, and the cover 50 that closes the opening 41 of the case 30 and includes the lid plate portion 51 and the cover-side peripheral wall portion 52 extending upright from the peripheral edge of the lid plate portion 51 and covering the perimeter of the case-side peripheral wall portion 32. The circuit structure 10 includes the circuit board 11 and the electronic components 12 that are mounted on the mounting surface 17 of the circuit board 11, and is accommodated in the case 30 such that the surface of the circuit board 11 on the side on which the electronic components 12 are mounted faces the opening 41. The circuit structure 10 is disposed in the case 30 with a space that allows water to pass through being provided between the inner surface of the bottom plate portion 31 and the circuit structure 10.

With this configuration, even if water enters a space between the case-side peripheral wall portion 32 and the cover-side peripheral wall portion 52 and goes all the way to the inside of the case-side peripheral wall portion 32, the water moves along the inside of the case-side peripheral wall portion 32 to reach the surface of the bottom plate portion 31, and falls downward through the space between the back surface (non-mounting surface 18) of the circuit board 11 and the inner surface of the bottom plate portion 31 of the case 30. Accordingly, even if water enters the inside of the case 30, adhesion of that water to the front surface (mounting surface 17) of the circuit board 11 can be avoided.

Also, it is preferable that the case-side peripheral wall portion 32 is formed such that the region thereof on the side of the opening 41 protrudes outward beyond the region thereof on the side of the bottom plate portion 31, and the step surface 42 is formed between the region on the side of the opening 41 and the region on the side of the bottom plate portion 31, the support protrusions 37, which support the circuit board 11 with a space left between the inner surface of the bottom plate portion 31 and the circuit board 11, are provided so as to protrude from the inner surface of the bottom plate portion 31, and in a state in which the circuit board 11 is supported by the support protrusions 37, the mounting surface 17 and the step surface 42 are at substantially the same height.

With this configuration, as large a space as possible can be secured as the space that allows water to pass through. Also, since the circuit board 11 is not disposed in a position at which the circuit board 11 protrudes toward the opening 41 beyond the step surface 42, an increase in the size of the electrical junction box 1 can be suppressed.

Moreover, the cover 50 includes the third upper plate portion 56, which protrudes from the lid plate portion 51 toward the case 30 and which, in a state in which the cover 50 and the case 30 are assembled, is disposed at a position to the inside of (below) the first upper plate portion 33 and overhangs the circuit structure 10.

With this configuration, even if water that has entered the space between the first upper plate portion 33 and the second upper plate portion 53 and gone all the way to the inside of the first upper plate portion 33 falls downward, that water is blocked by the third upper plate portion 56. Thus, even if water enters the inside of the case 30, adhesion of that water to the circuit board 11 can be more reliably avoided.

Furthermore, the protruding length of the third upper plate portion 56 is set at such a length that, in a state in which the circuit structure 10 is accommodated in the casing 20, the protruding end of the third upper plate portion 56 is positioned closer to the bottom plate portion 31 than the non-mounting surface 18 of the circuit board 11 is, while being slightly spaced apart from the inner surface of the bottom plate portion 31 of the case 30.

With this configuration, water that has entered the inside of the first upper plate portion 33 and fallen onto the third upper plate portion 56 moves on the upper surface of the third upper plate portion 56 and is guided to the side of the non-mounting surface 18 of the circuit board 11, and then falls downward along the inner surface of the bottom plate portion 31. Thus, adhesion of water that has entered the inside to the surface (mounting surface 17) of the circuit board 11 on the side on which the electronic components 12 are mounted can be more reliably avoided.

In particular, in the third upper plate portion 56, the region spanning from the protruding end to the position that is slightly shifted toward the opening from the protruding end serves as the second sloping surface 57 that slopes down toward the bottom plate portion 31 over the entire width of the third upper plate portion 56.

With this configuration, water that has fallen onto the third upper plate portion 56 rolls down toward the bottom plate portion 31 in accordance with the slope of the second sloping surface 57, and is therefore readily drained to the back side of the circuit board 11. Accordingly, even if water enters the inside of the case 30, adhesion of that water to the mounting surface 17 of the circuit board 11 can be more reliably avoided.

Furthermore, the drain hole 39 for draining water that has entered the inside of the case 30 is provided in the first lower plate portion 34 such that the drain hole 39 passes through the first lower plate portion 34 in the vertical direction, and the drain hole 39 is exposed to the outside from the cover-side connector opening 60 that is provided in the second lower plate portion 54.

With this configuration, even if water enters the inside of the case 30, that water is quickly drained to the outside through the drain hole 39 and then through the cover-side connector opening 60. Thus, a situation in which water entering the inside of the case 30 accumulates and adheres to the circuit structure 10 can be avoided.

Also, a water blocking structure as described above can be attained with a relatively small increase in the cost as compared with a case structure with respect to which no countermeasure is taken. For this reason, the electrical junction box 1 having a water blocking structure can be provided at low cost.

The present application is not limited to the foregoing description and the embodiment that has been described using the drawings, and, for example, embodiments as described below are also embraced within the technical scope of the present application.

(1) In the foregoing embodiment, a single drain hole 39 is provided. However, it is also possible that a plurality of drain holes are provided.

(2) In the foregoing embodiment, the drain hole 39 is provided in a position at which the drain hole 39 is exposed to the outside from the cover-side connector opening 60. However, the drain hole may also be formed in a position that is different from the position of the cover-side connector opening 60. It is also possible that a drain hole is provided in both of the first lower plate portion 34 of the case 30 and the second lower plate portion 54 of the cover 50. In this case, it is preferable that the two drain holes are provided in positions that are in alignment with each other.

(3) In the foregoing embodiment, the region of the third upper plate portion 56 that spans from the protruding end to the position that is slightly shifted toward the opening 41 from the protruding end serves as the second sloping surface 57 that slopes down toward the case 30. However, it is also possible that the entire upper surface of the third upper plate portion serves as a sloping surface that slopes down toward the case 30. Also, in the foregoing embodiment, the second sloping surface 57 is provided over the entire width of the third upper plate portion 56. However, it is also possible that the second sloping surface 57 is provided in only a portion of the third upper plate portion 56 with respect to its width direction.

The invention claimed is:

1. An electrical junction box comprising:

a case that comprises a bottom plate portion and a case-side peripheral wall portion extending upright from a peripheral edge of the bottom plate portion, the case having an opening that opens to a lateral side;

a circuit structure that is accommodated in the case; and a cover that closes the opening of the case and comprises a lid plate portion and a cover-side peripheral wall portion extending upright from a peripheral edge of the lid plate portion and covering a perimeter of the case-side peripheral wall portion, wherein the circuit structure comprises a circuit board and electronic components that are mounted on a mounting surface of the circuit board, and the circuit structure is accommodated in the case such that the mounting surface of the circuit board faces the opening, wherein the circuit structure is disposed in the case with a space that allows water to pass through being provided between an inner surface of the bottom plate portion and the circuit structure, and wherein the electrical junction box further includes a waterproof wall extending from the lid plate portion toward the case in a configuration in which the cover and the case are assembled, the waterproof wall located inside of the cover-side peripheral wall portion, and located inside of the case-side upper wall portion in a configuration in which the cover and case are assembled, wherein a protruding end of the waterproof wall extends closer to the bottom plate portion than a height from the bottom plate portion of an outer peripheral end of a non-mounting surface of the circuit board on which no electronic components are mounted such that the outer peripheral end of the circuit board is adjacent the protruding end of the waterproof wall in a configuration in which the cover and the case are assembled, the protruding end of the waterproof wall being slightly spaced apart from the bottom plate portion.

2. The electrical junction box according to claim 1, wherein the case-side peripheral wall portion is formed such that a region of the case-side peripheral wall portion on the side of the opening protrudes outward beyond a region of the case-side peripheral wall portion on the side of the bottom plate portion, and a step surface is formed between the region on the side of the opening and the region on the side of the bottom plate portion, wherein support protrusions protrude from the inner surface of the bottom plate portion, the support protrusions supporting the circuit board with a space provided between the inner surface of the bottom plate portion and the circuit board, and wherein in a configuration in which the circuit board is supported by the support protrusions, the mounting surface and the step surface are at substantially the same height.

3. The electrical junction box according to claim 1, wherein a sloping surface is formed on an upper surface of the waterproof wall, the sloping surface sloping down toward the bottom plate portion in a configuration in which the cover and the case are assembled.

4. The electrical junction box according to claim 1, wherein a drain hole is formed in at least one of a case-side lower wall portion of the case-side peripheral wall portion that is located on a lower side in a configuration in which the electrical junction box is used and a cover-side lower wall portion of the cover-side peripheral wall portion that is located on the lower side in the configuration in which the electrical junction box is used, the drain hole passing through the at least one of the case-side lower wall portion and the cover-side lower wall portion in a vertical direction.

5. The electrical junction box according to claim 2, wherein a drain hole is formed in at least one of a case-side lower wall portion of the case-side peripheral wall portion that is located on a lower side in a configuration in which the electrical junction box is used and a cover-side lower wall portion of the cover-side peripheral wall portion that is located on the lower side in the configuration in which the electrical junction box is used, the drain hole passing through the at least one of the case-side lower wall portion and the cover-side lower wall portion in a vertical direction.

* * * * *